United States Patent
Huang et al.

(10) Patent No.: US 7,087,483 B2
(45) Date of Patent: Aug. 8, 2006

(54) SINGLE TRANSISTOR RAM CELL AND METHOD OF MANUFACTURE

(75) Inventors: Chih-Mu Huang, Hsin-Chu (TW); Mingchu King, Hsinchu (TW); Yun Chang, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 18 days.

(21) Appl. No.: 10/723,072

(22) Filed: Nov. 25, 2003

(65) Prior Publication Data

US 2005/0110063 A1    May 26, 2005

(51) Int. Cl.
H01L 21/8242 (2006.01)
(52) U.S. Cl. ...................... 438/241; 438/239
(58) Field of Classification Search ................ 438/239, 438/241, 253, 254, 396, 397, 486
See application file for complete search history.

(56) References Cited

U.S. PATENT DOCUMENTS

| | | | |
|---|---|---|---|
| 6,395,621 B1 * | 5/2002 | Mizushima et al. | 438/486 |
| 6,468,855 B1 * | 10/2002 | Leung et al. | 438/239 |
| 6,642,098 B1 * | 11/2003 | Leung et al. | 438/241 |
| 6,670,664 B1 * | 12/2003 | Tzeng et al. | 257/296 |
| 6,784,048 B1 * | 8/2004 | Leung et al. | 438/239 |

* cited by examiner

Primary Examiner—Walter L Lindsay, Jr.
(74) Attorney, Agent, or Firm—Tung & Associates

(57) ABSTRACT

A single transistor planar RAM memory cell with improved charge retention and a method for forming the same, the method including forming a pass transistor structure adjacent a storage capacitor structure separated by a predetermined distance; carrying out a first ion implantation process to form first and second doped regions adjacent either side of the pass transistor structure, the first doped region defined by the predetermined distance; depositing a spacer dielectric layer; etching back the spacer dielectric layer to leave an unetched spacer dielectric layer portion overlying the first doped region while forming a sidewall spacer of a predetermined width overlying a first portion of the second doped region; and, carrying out a second ion implantation process to form a relatively higher dopant concentration in a second portion of the second doped region.

17 Claims, 3 Drawing Sheets

SINGLE TRANSISTOR RAM CELL AND METHOD OF MANUFACTURE

FIELD OF THE INVENTION

The present invention relates generally to semiconductor device manufacturing methods and more particularly to a single transistor DRAM memory cell with reduced size and increased Voltage retention time including a method for manufacturing the same.

BACKGROUND OF THE INVENTION

Dynamic random access memories (DRAM) are useful for maximizing the number of bits stored per unit surface area. In particular, a single transistor (1T) DRAM cell includes a single MOS transistor, also referred to as a pass transistor or an access transistor, which is connected to a word line which is used to switch the pass transistor on or off to thereby couple or decouple a bit line to a storage capacitor. When the storage capacitor is charged to a predetermined Voltage, the memory cell stores a "1" state. When the storage capacitor is charged to a lower predetermined Voltage, typically ground, the memory cell stores a "0" state.

The Voltage stored, e.g., as a "1" state in the memory cell decays over time to a lower "0" state Voltage (e.g., ground Voltage) through various leakage mechanisms. Unlike the charge replenishing process for static RAM, the only way to maintain the information in DRAM is by periodically reading and rewriting the data through a "refresh" operation. Avoiding current leakage and thereby maintaining charge retention in a DRAM cell is extremely important for scaling down memory cell size.

Several leakage mechanisms can affect the stored charge in DRAM cells including junction leakage, pass transistor threshold leakage and leakage through the storage capacitor dielectric as well as other parasitic leakage paths. In particular, prior art memory 1T DRAM memory cells, including for example, planar storage capacitors have unacceptable charge retention times for future applications at required memory cell densities.

Therefore, there is a continuing need in the DRAM processing art to develop a DRAM memory cell with improved charge retention time and reduced size while avoiding undue manufacturing cost.

It is therefore among the objects of the invention to provide a DRAM memory cell with improved charge retention time and reduced size while avoiding undue manufacturing cost, in addition to overcoming other shortcomings and deficiencies of the prior art.

SUMMARY OF THE INVENTION

To achieve the foregoing and other objects, and in accordance with the purposes of the present invention, as embodied and broadly described herein, the present invention provides a single transistor RAM cell structure with improved charge retention and method for forming the same.

In a first embodiment, the method includes providing a silicon substrate comprising an STI structure and an overlying dielectric gate layer; depositing a polysilicon layer; forming a pass transistor structure adjacent a storage capacitor structure separated by a predetermined distance; carrying out a first ion implantation process to form first and second doped regions adjacent either side of the pass transistor structure, the first doped region defined by the predetermined distance; depositing a spacer dielectric layer; etching back the spacer dielectric layer to leave an unetched spacer dielectric layer portion overlying the first doped region while forming a sidewall spacer of a predetermined width overlying a first portion of the second doped region; and, carrying out a second ion implantation process to form a relatively higher dopant concentration in a second portion of the second doped region.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Although the method of the present invention is explained with reference to the formation of a planar storage capacitor with an oxide dielectric, it will be appreciated that the 1T DRAM cell of the present invention may be formed using other capacitor dielectric materials including high dielectric constant materials, for example having a dielectric constant of greater than about 10.

Figure 1A:
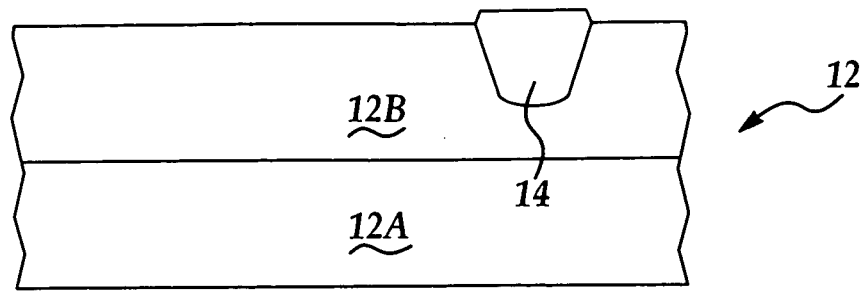
FIGS. 1A–1F are cross sectional views of a portion of a single transistor DRAM memory cell at stages in production according to an embodiment of the invention.

Referring to FIG. 1A is shown a cross sectional view of a portion of a process wafer having formed therein an exemplary shallow trench isolation (STI) structure 14 formed by conventional processes in a P doped silicon substrate 12, having a P-doped region 12A and an N-well doped region 12B formed adjacent to the STI structure 14 in an active region of the device. Although the formation and preferred embodiment as shown in the Figures is of a PMOS pass transistor type DRAM memory cell, it will be appreciated that the NMOS pass transistors may be formed as well with appropriate differences in the type of dopant e.g., N or P-type dopants, as is known in the art.

Still referring to FIG. 1A, the STI structure 14 formation process begins with the formation of a pad oxide layer (not shown) thermally grown over the silicon substrate 12, for example formed by conventional dry or wet thermal oxidation methods, followed by formation of an overlying nitride layer (not shown), for example silicon nitride (e.g., $Si_3N_4$) formed by a conventional CVD, e.g., LPCVD process. A conventional lithographic and etching process is then carried out whereby the nitride layer and pad oxide layer are first etched to form a hard mask followed by etching an STI trench with preferred properties including having sidewalls at an angle from about 70 to about 85 degrees and having rounded bottom corners to reduce stress. An oxide liner (not shown) is then thermally grown to line the trench (not shown) followed by backfilling with silicon oxide (e.g., $SiO_2$) by e.g., an HDP-CVD process, also referred to as STI oxide.

The STI oxide is then planarized by a CMP process to stop on the silicon nitride layer (not shown) followed by removal of the silicon nitride layer and pad oxide layer by a conventional wet stripping, e.g., hot $H_3PO_4$, and HF respectively, to leave the STI oxide structure 14. A sacrificial oxide layer (not shown) is then thermally grown over the silicon substrate to modify a subsequent high energy (e.g. 500 keV to 1 MeV) ion implant, e.g., phosphorous, to form an N-well region, e.g., 12B. Following conventional masking and ion implantation processes, (e.g., retrograde well and $V_t$ adjustment implants) the N-well region 12B is formed followed by removal of oxides overlying the silicon substrate 12 by a conventional HF wet stripping process. The silicon substrate 12 is then cleaned by conventional processes, for example, using standard cleaning 1 (SC-1) and/or standard cleaning-2 (SC-2) solutions, including mixtures of $NH_4OH$—$H_2O_2$—$H_2O$, and $HCl$—$H_2O_2$—$H_2O$, respectively.

Figure 1B:
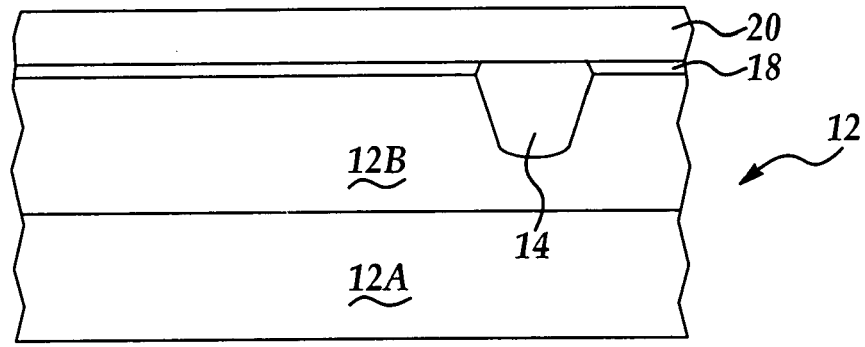

Referring to FIG. 1B, a gate dielectric layer or stack e.g., 18, is formed over the silicon substrate 12. For example a thermally grown gate oxide (e.g., $SiO_2$) layer may be suitably used as the gate dielectric, for example, thermally grown by wet or dry methods at temperatures from about 900° C. to about 1150° C. and preferably having a thickness of from about 20 to about 50 Angstroms. It will be appreciated that the gate oxide layer e.g., 18 may be subjected to nitridation techniques such as nitrogen containing plasma and/or annealing treatments to increase the dielectric constant. In addition, alternating layers of silicon oxide/silicon nitride or silicon oxynitride, also referred to as an oxide/nitride gate dielectric may be formed as the gate dielectric stack e.g., 18.

In addition, one or more layers of a high-K dielectric (e.g., dielectric constant greater than about 10), for example, tantalum pentaoxide (e.g., $Ta_2O_5$) may be used to form the gate dielectric 18. Other metal oxides such as, titanium oxides, (e.g., $TiO_2$), hafnium oxides (e.g., $HfO_2$), yttrium oxides (e.g., $Y_2O_3$), lanthanum oxides (e.g., $La_2O_5$), zirconium oxides (e.g., $ZrO_2$), and silicates and aluminates thereof may also be suitably used to form the gate dielectric 18, for example having an equivalent oxide thickness (EOT) of an $SiO_2$ gate dielectric, e.g., having a thickness of from about 50 Angstroms to about 200 Angstroms formed over a thermally grown interfacial oxide layer (not shown) formed over the silicon substrate 12. For example, atomic layer chemical vapor deposition (ALCVD) methods, followed by annealing treatments in oxygen, nitrogen and/or hydrogen may be used to form a high-K gate dielectric layer stack. Further, other high dielectric constant materials, such as $BaSrTiO_3$ (BST), and $PbZrTiO_3$ (PZT) or other high-K materials, preferably having a dielectric constant greater than about 10, more preferably about 20, may be suitably used to form a high-K gate dielectric stack.

Still Referring to FIG. 1B, a polysilicon layer 20 is deposited over the gate dielectric layer 18 by conventional techniques e.g., an LPCVD process to a thickness of about 2000 Angstroms to about 4000 Angstroms. Preferably the polysilicon layer 20 is deposited undoped and is subsequently doped (e.g., using P-dopants, e.g., boron) simultaneously with an ion implantation process to form doped contact regions, e.g., source/drain regions adjacent the pass transistor as explained further below.

Figure 1C:
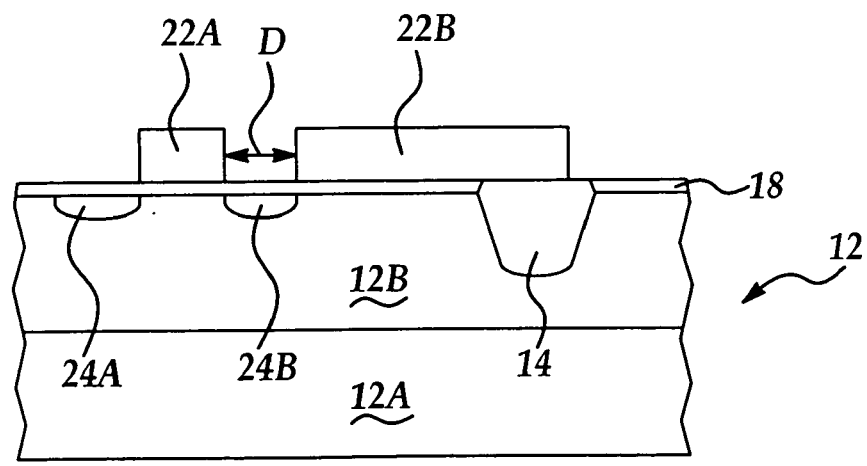

Referring to FIG. 1C, a conventional photolithographic patterning and etching process is carried on the polysilicon layer 20 to define gate structures e.g., 22A for the pass transistor and capacitor structures e.g., 22B for the storage capacitor in a DRAM memory cell. Preferably the storage capacitor structure 22B is formed as a planar capacitor, e.g., the capacitor dielectric e.g., gate dielectric layer 18 as well as the overlying polysilicon electrode portion (e.g., plate) is formed co-planar with the silicon substrate 12 process surface. In an important aspect of the invention, a distance D between the pass transistor structure, e.g., 22A and the storage capacitor 22B is selected such that it is less than about twice, for example from about 1 times to about 1 and ¾ times the width of a subsequently formed sidewall spacer as explained and shown further below.

A conventional ion implantation doping process, also referred to as an LDD implant, is then carried to form, for example, P-doped source/drain extension (SDE) portions of P-doped regions e.g., 24A and 24B adjacent either side of the pass transistor 22A and adjacent one side of the storage capacitor 22B. A P-type dopant implant, for example boron, is carried out at a dose (concentration) preferably ranging from about $10^{12}$ to about $10^{14}$ dopant atoms/cm$^2$ to form P doped regions 24A and 24B. It will be appreciated that other methods to achieve a shallow implant may be used, e.g., from about 200 Angstroms to about 1000 Angstroms in depth, depending on the scaled design of the transistor, for example less than about 0.25 micron CMOS technology, including less than about 0.18 micron CMOS technology. For example, gas immersion laser doping and plasma immersion doping methods as are known in the art may be used, however, ion implantation methods are preferred.

Figure 1D:
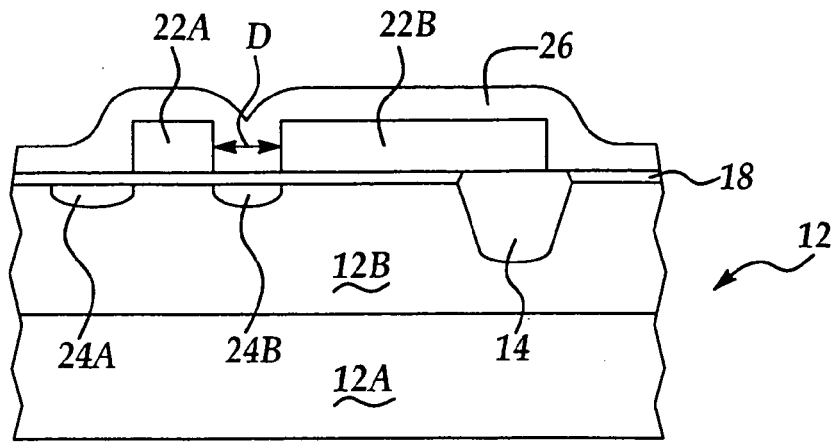

Referring to FIG. 1D, in an important aspect of the invention, sidewall spacer dielectric material, for example including one or more layers e.g., 26 of silicon oxide ($SiO_2$), silicon nitride (e.g., SiN), and silicon oxynitride (e.g., SiON) is deposited, for example using a blanket (e.g., substantially conformal) deposition process such as LPCVD, PECVD or HDP-CVD, to about a thickness of a desired sidewall spacer width, for example equal to or greater than the predetermined distance D to at least partially, preferably substantially fill the space defined by distance D between pass transistor 22A and storage capacitor 22B. The thickness of the layer 26 for example, is between about 500 Angstroms and about 2000 Angstroms.

Figure 1E:
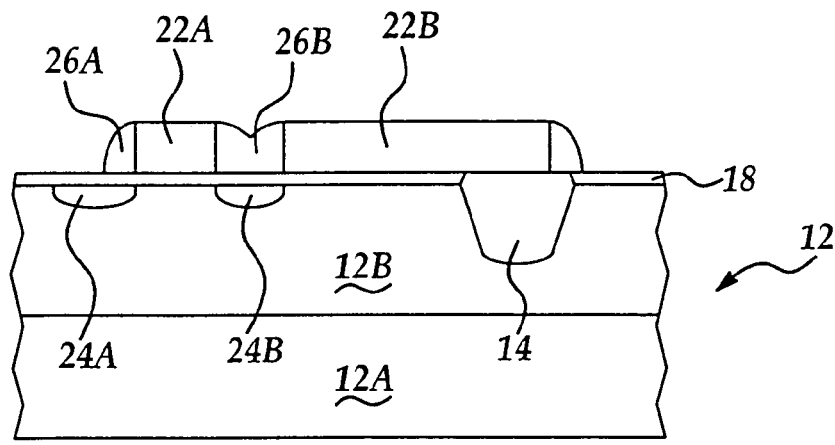

Referring to FIG. 1E, a conventional wet or dry etchback process, preferably a dry (plasma enhanced) etchback process is then carried out to etchback sidewall spacer dielectric layer 26 to form sidewall spacers e.g., 26A and leaving a sidewall spacer layer portion 26B remaining between the storage capacitor 22B and the pass transistor 22A to cover P doped region 24B following the plasma enhanced etchback process. Advantageously, by forming pass transistor portion 22A and storage capacitor 22B to have a predetermined distance D between the respective structures of less than about twice a sidewall spacer width, the sidewall spacer etchback process leaves an unetched dielectric sidewall spacer layer portion e.g., 26B, covering the P-doped region 24B thereby forming an implant mask in a subsequent ion implant process e.g., HDD, to form a more heavily doped contact region e.g., 24A.

Still referring to FIG. 1E, a second P type ion implantation process, e.g., boron, is then carried out to increase the P doping level and depth in doped region e.g., 24A in a self aligned ion implantation process to form a P+ doped region in doped region 24A. The second ion implantation process is carried out to form P+ doped region 24A preferably at a dose (concentration) greater than about $10^{15}$ dopant atoms/cm$^2$. In an important aspect of the invention, the unetched sidewall dielectric layer spacer portion 26B acts as an ion implant mask to block further P doping of the region 24B in the second ion implantation process thereby forming a relatively lightly doped regions, e.g., a P– doped region 24B relative to P+ doped region 24A.

Figure 1F:
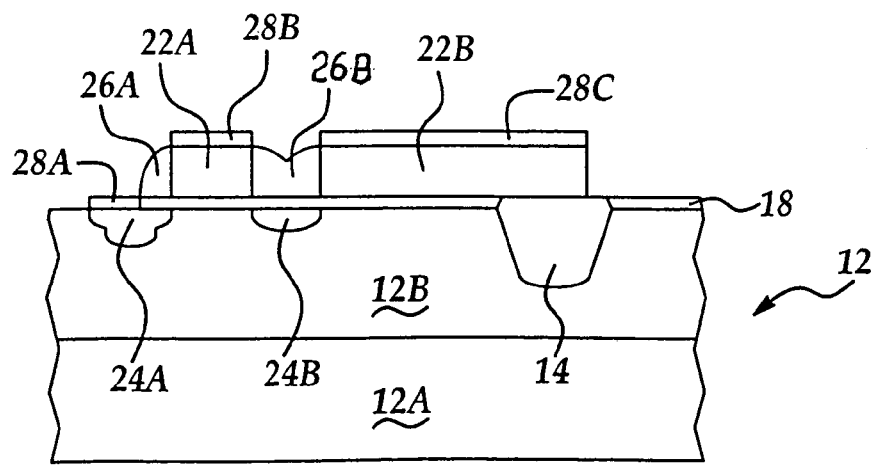

Referring to FIG. 1F, a conventional salicide (self aligned silicide) formation process is then carried out by first removing material layers overlying the silicon substrate 12 (e.g., oxide portions), followed by deposition of a metal, for example Ti or Co and a silicidation process to form salicides e.g., TiSi$_2$ or CoSi$_2$, 28A, 28B, and 28C respectively aligned over P+ doped region 24A, the pass transistor 22A, and the storage capacitor 22B. Advantageously the unetched spacer dielectric layer portion 26B operates to prevent salicide formation over the P− doped region 24B. Conventional process are then carried out to form appropriate conductive interconnects (not shown), for example providing a respective conductive interconnects to electrically connect to e.g., salicide portion 28A (bit line) of P+ doped region 24A, salicide portion 28B (word line) of pass transistor 22A, and salicide portion 28C of storage capacitor 22B.

Advantageously according to the 1T RAM structure formed according to the method of the present invention current leakage is reduced including junction leakage path through the doped portion 24B from the storage capacitor thereby increasing a charge retention time and refresh cycle time. The reduced charge (current) leakage is believed to be due to the formation of a relatively lower doping level formed at the storage node region e.g., doped region 24B which is advantageously accomplished without additional process steps. In addition, the formation of salicides 28A, 28B, and 28C over desired electrical contact portions of the wafer is accomplished without forming a silicide portion over the storage node region 24B, which is believed to contribute to parasitic current leakage paths. As a result, the 1T RAM structure according to exemplary embodiments advantageously accomplishes increased charge retention while reducing a memory cell size and avoiding extra processing steps.

Figure 2:
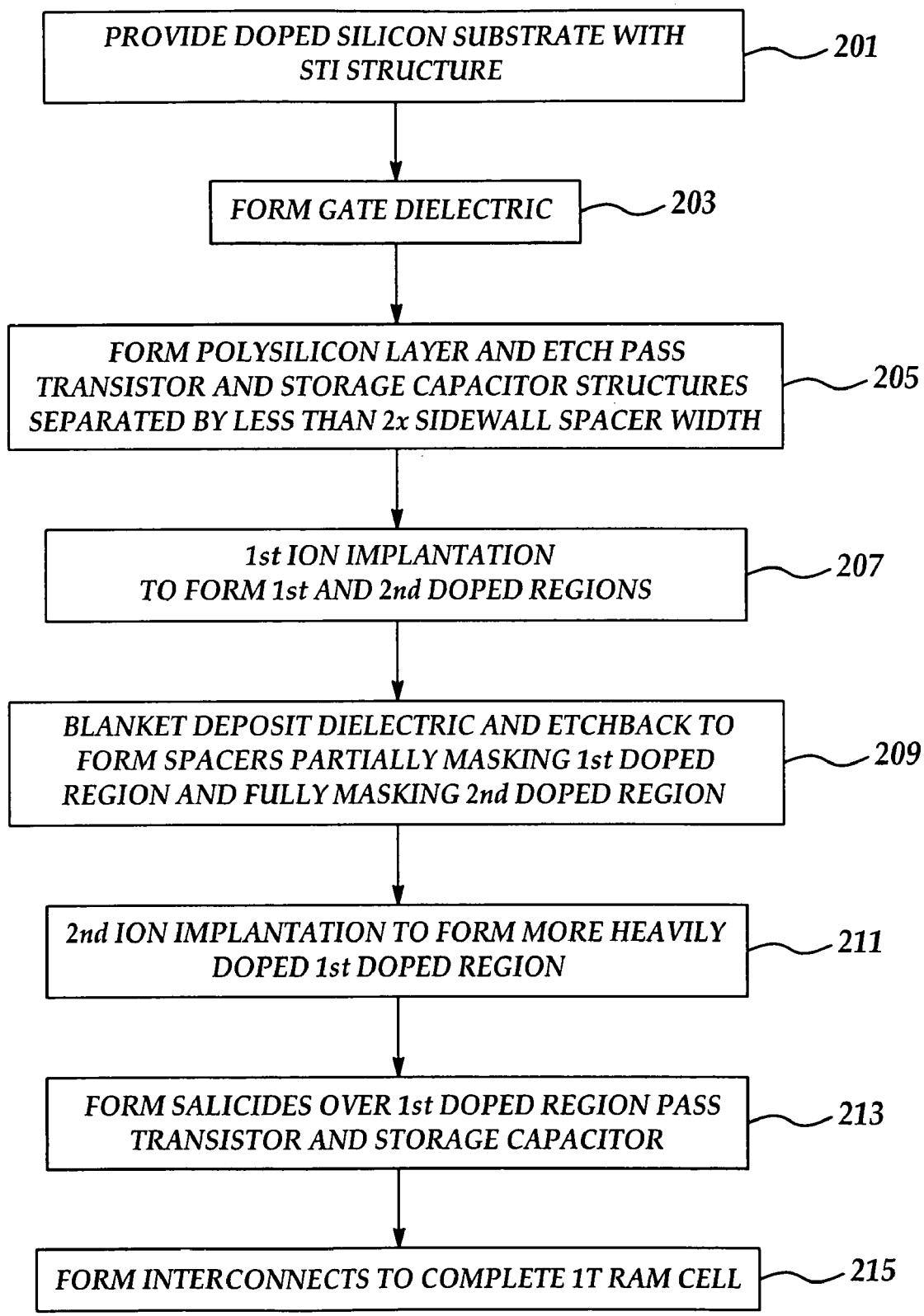
FIG. 2 is a process flow diagram including several embodiments of the present invention.

Referring to FIG. 2 is a process flow diagram including several embodiments of the present invention. In process 201, an STI structure is provided in a doped silicon substrate. In process 203 a gate dielectric is formed over the silicon substrate. In process 205, a polysilicon layer is deposited and etched to form a pass transistor structure adjacent a storage capacitor separated by a predetermined distance less than about twice a subsequently formed sidewall spacer width. In process 207, a first ion implant process is carried out to form first and second doped regions adjacent either side of the pass transistor. In process 209, a spacer dielectric layer is deposited and etched back to form a sidewall spacer over a portion (partially masking) the first doped region while leaving a spacer dielectric layer portion overlying (fully masking) the second doped region defined by the predetermined distance. In process 211, a second ion implantation process is carried to form a more heavily doped silicon region in the exposed portion of the first doped region. In process 213, a salicide formation process is carried out to form silicided regions over the first doped region, the pass transistor, and the storage capacitor. In process 215, bit lines, word lines and storage capacitor interconnects are formed to complete formation of a single transistor (1T) RAM memory cell.

While the embodiments illustrated in the Figures and described above are presently preferred, it should be understood these embodiments are offered by way of example only. The invention is not limited to a particular embodiment, but extends to various modifications, combinations, and permutations fall occur to the ordinarily skilled artisan that nevertheless within the scope of the appended claims.

What is claimed is:

1. A method for forming a single transistor planar RAM memory cell with improved charge retention comprising the steps of:
   providing a silicon substrate comprising an STI structure and an overlying dielectric gate layer;
   depositing a polysilicon layer;
   forming a pass transistor structure adjacent a planar storage capacitor structure separated by a predetermined distance;
   carrying out a first ion implantation process to form first and second P− doped regions adjacent either side of the pass transistor structure, the first doped region defined by the predetermined distance;
   depositing a spacer dielectric layer;
   etching back the spacer dielectric layer to form an ion implant mask fully covering the first doped region while forming a sidewall spacer of a predetermined width overlying a first portion of the second doped region;
   wherein the predetermined distance is less than twice the predetermined width; and,
   carrying out a second ion implantation process to form a P+ doped region in a second portion of the second doped region while retaining the P− doped region in the first doped region.

2. The method of claim 1, further comprising the step of forming self aligned silicide regions over the second portion, the pass transistor structure and the storage capacitor structure.

3. The method of claim 1, wherein the dielectric gate layer is selected from the group consisting of SiO$_2$, nitrided SiO$_2$, and oxide/nitride.

4. The method of claim 1, wherein the dielectric gate layer comprises material selected from the group consisting of Ta$_2$O$_5$, TiO$_2$, HfO$_2$, Y$_2$O$_3$, La$_2$O$_5$, ZrO$_2$, BST, and PZT.

5. The method of claim 1, wherein the storage capacitor structure is formed at least partially overlying the STI structure.

6. The method of claim 1, wherein the spacer dielectric layer thickness is about greater than about half of the predetermined distance.

7. The method of claim 1, wherein the pass transistor structure and the storage capacitor structure comprise a memory cell formed over an N doped well region of a P doped silicon substrate.

8. The method of claim 1, wherein the P− doped region is doped to a level of between about $10^{12}$ and $10^{14}$ dopant atoms/cm$^2$ and the P+ doped region is doped to a level greater than about $10^{15}$ dopant atoms/cm$^2$.

9. The method of claim 1, wherein the spacer dielectric layer comprises one or more layers selected from the group consisting of silicon oxide, silicon nitride, and silicon oxynitride.

10. A method for forming a single transistor planar RAM memory cell with improved charge retention comprising the steps of:
    providing a silicon substrate comprising an STI structure and an overlying dielectric gate layer;
    depositing a polysilicon layer;
    forming a pass transistor structure adjacent a planar storage capacitor structure separated by a predetermined distance for forming a first doped region;
    carrying out a first ion implantation process to form the first doped region and a second doped region to form P− doped regions adjacent the pass transistor structure;
    blanket depositing a spacer dielectric layer having a thickness about greater than the predetermined distance to substantially fill a space between the pass transistor structure and the storage capacitor structure;
    etching back the spacer dielectric layer to form an ion implant mask fully covering the first doped region while forming a sidewall spacer overlying a first portion of the second doped region;

wherein the predetermined distance is less than twice the sidewall spacer width; and, carrying out a second ion implantation process to form a relatively higher dopant concentration to form a P+ doped region in a second portion of the second doped region while retaining the P− doped region in the first doped region.

11. The method of claim 10, further comprising the step of forming salicide regions over the second portion, the pass transistor structure and the storage capacitor structure.

12. The method of claim 10, wherein the dielectric gate layer is selected from the group consisting of $SiO_2$, nitrided $SiO_2$, and oxide/nitride.

13. The method of claim 10, wherein the dielectric gate layer comprises material selected from the group consisting of $Ta_2O_5$, $TiO_2$, $HfO_2$, $Y_2O_3$, $La_2O_5$, $ZrO_2$, BST, and PZT.

14. The method of claim 10, wherein the storage capacitor structure is formed at least partially overlying the STI structure.

15. The method of claim 10, wherein the pass transistor structure and the storage capacitor structure comprise a memory cell formed over an N doped well region of a P doped silicon substrate.

16. The method of claim 10, wherein the P− doped region is doped to a level of between about $10^{12}$ and $10^{14}$ dopant atoms/$cm^2$ and the P+ doped region is doped to a level greater than about $10^{15}$ dopant atoms/$cm^2$.

17. The method of claim 10, wherein the spacer dielectric layer comprises one or more layers selected from the group consisting of silicon oxide, silicon nitride, and silicon oxynitride.

* * * * *